(12) United States Patent
Khazaka et al.

(10) Patent No.: US 12,494,378 B2
(45) Date of Patent: Dec. 9, 2025

(54) METHOD FOR MANUFACTURING AN ELECTRONIC POWER MODULE

(71) Applicant: SAFRAN, Paris (FR)

(72) Inventors: Rabih Khazaka, Moissy-Cramayel (FR); Baptiste Joël Christian Fedi, Moissy-Cramayel (FR); Toni Youssef, Moissy-Cramayel (FR); Pierre Jean Sallot, Moissy-Cramayel (FR)

(73) Assignee: SAFRAN, Paris (FR)

( * ) Notice: Subject to any disclaimer, the term of this patent is extended or adjusted under 35 U.S.C. 154(b) by 833 days.

(21) Appl. No.: 17/609,093

(22) PCT Filed: Apr. 24, 2020

(86) PCT No.: PCT/FR2020/050710
§ 371 (c)(1),
(2) Date: Nov. 5, 2021

(87) PCT Pub. No.: WO2020/225500
PCT Pub. Date: Nov. 12, 2020

(65) Prior Publication Data
US 2022/0216069 A1    Jul. 7, 2022

(30) Foreign Application Priority Data
May 6, 2019   (FR) ...................................... 1904736

(51) Int. Cl.
*H01L 21/48* (2006.01)
*B33Y 10/00* (2015.01)
(Continued)

(52) U.S. Cl.
CPC .......... *H01L 21/4857* (2013.01); *B33Y 10/00* (2014.12); *B33Y 80/00* (2014.12); *H01L 24/83* (2013.01); *H01L 2224/8384* (2013.01)

(58) Field of Classification Search
CPC . H01L 21/4871; H01L 23/3735; H01L 23/46; H01L 23/467; H01L 23/473;
(Continued)

(56) References Cited

U.S. PATENT DOCUMENTS

| 2013/0256894 A1 | 10/2013 | Adema |
| 2017/0278763 A1* | 9/2017 | Li ............................ H01L 24/29 |
| 2019/0198449 A1* | 6/2019 | Herrault .................. H01L 24/24 |

FOREIGN PATENT DOCUMENTS

| DE | 102012200325 A1 | 3/2013 |
| FR | 3060846 A1 | 6/2018 |
| FR | 3061989 A1 | 7/2018 |

OTHER PUBLICATIONS

English translation of Written Opinion mailed Dec. 15, 2020, issued in corresponding International Application No. PCT/FR2020/050710, filed Apr. 24, 2020, 4 pages.
(Continued)

*Primary Examiner* — Julio J Maldonado
*Assistant Examiner* — Stanetta D Isaac
(74) *Attorney, Agent, or Firm* — CHRISTENSEN O'CONNOR JOHNSON KINDNESS PLLC

(57) ABSTRACT

A method for manufacturing a power electronic module by additive manufacturing includes the step of depositing a layer of an electrically conductive nanoporous material on a substrate that includes an electrically insulating layer and at least one layer of conductive metal material, called a metallized substrate. The method further includes the step of placing an element, for example an active component of the semiconductor power component type, on the layer of nanoporous material and sintering the layer of nanoporous material, so as to ensure a mechanical and electrical connection between said element and the metallized substrate.

20 Claims, 4 Drawing Sheets

(51) Int. Cl.
B33Y 80/00 (2015.01)
H01L 23/00 (2006.01)

(58) Field of Classification Search
CPC ............ H01L 23/49811; H01L 25/072; H01L 2224/48137; H01L 2224/48227; H01L 2224/73265; H01L 2924/181; H01L 25/16; H01L 21/4853; H01L 25/50; H01L 25/18; H01L 24/83; H01L 2224/27462; H01L 2224/8384; H01L 2224/2747; H01L 2224/29347; H01L 2224/32225; H01L 2224/33181; H01L 2224/48091; H01L 2224/83075; H01L 2224/83192; H01L 2224/83224; H01L 24/29; H01L 24/32; H01L 24/92; H01L 24/27; H01L 24/33; H01L 21/4857; B33Y 80/00; B33Y 10/00; Y02P 10/25
See application file for complete search history.

(56) References Cited

OTHER PUBLICATIONS

International Preliminary Report on Patentability mailed Nov. 2, 2021, issued in corresponding International Application No. PCT/FR2020/050710, filed Apr. 24, 2020, 6 pages.

International Search Report mailed Dec. 15, 2020, issued in corresponding International Application No. PCT/FR2020/050710, filed Apr. 24, 2020, 5 pages.

Written Opinion mailed Dec. 15, 2020, issued in corresponding International Application No. PCT/FR2020/050710, filed Apr. 24, 2020, 5 pages.

\* cited by examiner

METHOD FOR MANUFACTURING AN ELECTRONIC POWER MODULE

FIELD OF THE DISCLOSURE

The disclosure relates to a method for manufacturing an electronic power module by additive manufacturing, as well as to an electronic power module obtained using such a method. The present disclosure has a particular application in the field of aeronautics where thermal stresses can be severe.

BACKGROUND

Power electronic modules are used in converters required for the electrification of propulsive and non-propulsive systems on board aircraft in order to convert the electrical energy from the main grid (115V AC, 230V AC, 540V DC.) into several forms (AC/DC, DC/AC, AC/AC and DC/DC).

FIG. 1 illustrates a power electronic module 1 of the prior art. This comprises a substrate 2a comprising an electrically insulating layer 2c of ceramic material, coated on each of its opposite faces with a metal layer 2d, 2e. Such an assembly is referred to as a metallized substrate 2a.

The top metal layer 2d forms a power circuit on which power semiconductor components 3 are assembled. The power electronic module 1 comprises an electrical and/or mechanical interconnection joint 4 through which the power semiconductor components 3 and connectors 5 are assembled to the power circuit. Due to their imperfections, power semiconductor components 3 are subject to Joule effect losses and therefore represent a significant source of heat.

The power semiconductor components 3 are electrically interconnected with each other and with the connectors 5 by means of the wiring wires 6. A housing 7, generally made of polymer, is bonded with an adhesive seal 8 to the substrate 2a or to a metal base 9 on which the substrate 2a is arranged. The housing 7 is filled with an encapsulant 10, such as a gel or epoxy, to provide mechanical and electrical protection for the power components 3 and the wiring wires 6.

The lower metal layer 2e of the substrate 2a is attached to the metal base 9, which has the function of spreading the heat flow and providing a thermal connection to a metal heat sink 11. As illustrated in FIG. 1, the power electronic module 1 comprises an electrical and/or mechanical interconnection joint 12 by means of which the lower metal layer 2e of the substrate 2 is attached to the base 9.

The base 9 is itself bonded to the heat sink 11 via a layer 13 of thermal interface material, such as thermal grease, elastomeric film, or phase change materials. The layer 13 of thermal interface material reduces the contact thermal resistance between the base 9 and the heat sink 11 to ensure better heat flow evacuation. The heat sink 11, is provided with fins 14 allowing to further reduce the thermal resistance of the latter, the fins 14 being traversed by a cooling fluid, for example air.

Such a power electronic module 1 is known in particular from FR 3 061 989.

Other power electronic modules are also known from US 2013/0020694, US 2016/0073535, US 2016/0126157, U.S. Pat. Nos. 8,432,030 and 8,358,000.

In some power electronic modules (see in particular US 2013/0020694, US 2016/0126157, U.S. Pat. No. 8,432,030) the power semiconductor components are directly soldered to large areas of the metallized substrates. The distance between the control and power electrodes present on the the components is very small, of the order of a few microns, especially for components with large gaps (SiC, GaN), thus making very high the risk of short-circuiting during the soldering method.

On the other hand, for high-temperature applications, i.e. temperatures above 200° C., solders are generally made from lead. Such solders are not compatible with the directives aimed at limiting the use of hazardous substances. It is also known how to make gold-based solders. However, such solders have a high cost and limited thermomechanical reliability. ZnAl-type solders suffer from poor wettability.

U.S. Pat. No. 8,358,000 discloses a manufacturing method for providing a connection to nearby electrodes without the risk of shorting while providing insulation between the connectors. Such a method is complex and costly to implement.

In US 2013/0020694, US 2016/0073535, US 2016/0126157 and U.S. Pat. No. 8,358,000, the heat exchanger is thermally coupled to the metallized substrate using a thermal interface material. In the case of brazing or sintering of the thermal interface material, the resulting thermal resistance is low, but the method remains complex to implement and the mechanical stresses in the resulting joint are very high, thus limiting its thermomechanical reliability. For soldered joints, this is due to the complexity of soldering metallized substrates to the radiator with low voids because of their curvatures and large contact areas. For sintering, this is due to the need to apply high and homogeneous forces that degrade the final properties of the joints. In the case of the use of flexible seals, such as thermal grease, the method is easy to implement but the materials are not compatible with temperatures above 175° C. and have low thermal conductivities (around 2 W/mK).

In the case of U.S. Pat. No. 8,432,030, the problem with the thermal interface material is eliminated by using a cooling fluid in direct contact with the underside of the substrates. However, in this configuration, the exchange surface is greatly reduced and the convective thermal resistance is higher.

SUMMARY

The disclosure aims to remedy these drawbacks in a simple, reliable and inexpensive way.

To this end, the disclosure relates to a method for manufacturing a power electronic module by additive manufacturing, characterized in that it comprises the steps of:
  depositing in a single step, by electrodeposition, a layer of an electrically conductive nanoporous material directly on a substrate comprising an electrically insulating layer and at least one layer of conductive metal material, called a metallized substrate,
  placing an element, for example an active component of the semiconductor power component type, on the layer of nanoporous material and sintering the layer of nanoporous material, so as to ensure a mechanical and electrical connection between the element and the metallized substrate.

A nanoporous material is a material with pores smaller than 1 micron in size.

The pores may have dimensions between 10 and 400 nm, for example.

The sintering operation ensures an effective and easy-to-implement bond between the element and the metallized substrate.

The layer of nanoporous material is produced in a single step by an electroplating method and is directly physically attached to the metallized substrate, thus forming an integral unit.

The nanoporous layer can be produced by dipping in an electrolytic bath, the relevant areas being connected to an electrical potential via an electrode. The nanoporous material can be obtained in a single step by adding additives to the electrolyte bath and/or by using current pulses, as is known per se.

The layer of nanoporous material has, for example, a thickness between 1 and 100 microns. The sintering can be carried out at a temperature of 200° C. to 300° C. with a pressure of 1 to 10 MPa. This allows a good bond to be achieved without impacting the properties of the components and substrates to be joined. In order to avoid oxidation, sintering can be carried out in an inert atmosphere or by rapid laser sintering.

The method for may include the steps of:
making or fixing preforms of polymer material on at least one side of the metallized substrate,
depositing a first metal layer on the preform,
depositing, by electroforming, a second metal layer on the first metal layer.

Preforms can be made by additive manufacturing. The preforms can be made or fixed on at least two opposite sides of the metallized substrate.

The second layer can have a thickness of between a few microns and a few millimeters, depending on requirements. The thickness of the second layer can be varied as a function of the applied voltage and bias time applied during the electroforming deposition step. During electroforming, all or part of the metal substrate and the first metal layer are immersed in an electrolytic bath containing metal ions, for example copper in ionic form. An electrode is electrically connected to the first metal layer, an electrical potential being applied to the electrode so as to deposit the filler metal of the electrolytic bath on the first metal layer. The non-metallic areas of the substrate that are not at electrode potential are then not covered with filler metal.

The layer of nanoporous material can be deposited on the second metal layer.

The method may include a step of dissolving the polymeric preforms chemically or thermally.

This makes it possible to create recessed areas, connectors or channels in the resulting power electronics module. In particular, the channels can facilitate heat exchange for cooling the assembly, for example by means of an air flow or a liquid coolant.

The method can include a step of covering at least one area of the conductive layer of the metallized substrate with a protective film of non-conductive material prior to deposition of the first metal layer and the second metal layer.

The protection film is made of polymeric material, for example.

The protection film prevents the deposition of metal on the area covered by the metallized substrate.

The protection film can be removed during the preform dissolving step.

The method may include a step of removing at least one area of the protective film so as to form an opening, a spike being obtained by depositing the first and second metal layers in the opening.

Each spike may provide an electrical connection between a track formed in the conductive layer of the metallized substrate and an element, such as a power semiconductor device or other conductive track.

The method for the disclosure may include the steps of:
depositing a layer of an electrically conductive nanoporous material on a first substrate comprising an electrically insulating layer and at least one layer of conductive metal material, called the first metallized substrate, so as to form a first assembly, —depositing a layer of an electrically conductive nanoporous material on at least one spike formed on a second substrate comprising an electrically insulating layer and at least one layer of conductive metal material, called the second metallized substrate, so as to form a second assembly called second metallized substrate, so as to form a second assembly,
placing at least one element, for example a semiconductor power component, between the layers of nanoporous material of the first and second assemblies,
sintering the layers of nanoporous material of the first and second assemblies, so as to ensure a mechanical and electrical bond between the element and the metallized substrates of the first and second assemblies.

The layers of nanoporous material can be sintered in separate sintering operations. Alternatively, the layers of nanoporous material can be sintered simultaneously.

At least one spike may connect the metallized substrate of the first assembly, in particular a track of the substrate, and the metallized substrate of the second assembly, in particular a track of the substrate, via a layer of sintered nanoporous material.

The substrate may comprise at least one ceramic insulating layer.

The metal layer(s) of the metallized substrate can be joined to the insulating layer by Active Metal Brazing (AMB), Direct Bonded Copper (DBC), or Direct Bonded Aluminum (DBA).

The insulating layer may also be a polymer layer.

The first metal layer may be less than 5 microns thick, preferably less than 1 micron.

The first metal layer can be deposited on the preform by chemical reduction via spraying.

The power electronic module may comprise a housing in which the metallized substrate and the active component are housed, the method comprising a step of filling the housing, at least in part, with an insulating material.

The insulating material is, for example, a gel based on silicone or epoxy resin.

The disclosure also relates to a power electronic module obtained by the above-mentioned method, comprising a metallized substrate and an active component mounted on a first face of the metallized substrate, by means of a layer of sintered nanoporous material, a heat sink comprising cooling channels extending from a second face of the metallized substrate, opposite the first face.

The power electronics module may include at least one connector that is electrically connected to the metallized substrate.

The connector may be formed by a conductive member extending from the first side of the metallized substrate.

The power electronics module may comprise a first assembly comprising a first metallized substrate and a second assembly comprising a second metallized substrate.

A first metal layer of the first metallized substrate may include tracks that are electrically isolated from each other.

A first metal layer of the second metallized substrate may include tracks that are electrically isolated from each other.

A heat sink having channels may extend from a second metal layer of the first metallized substrate opposite the first metal layer.

A heat sink having channels may extend from a second metal layer of the second metallized substrate opposite the first metal layer.

Spikes may extend from at least one track of the first metal layer of the second metallized substrate.

A first face of the active component may be electrically connected to at least one track of the first metallized substrate via a layer of sintered nanoporous material.

A second face of the active component may be electrically connected to at least one track of the second metallized substrate via at least a first spike and a layer of sintered nanoporous material located between the spike and the second face of the active component.

A track of the first metallized substrate can be connected to a track of the second metallized substrate via at least one second spike and a layer of sintered nanoporous material located between the spike and the track of the first metallized substrate.

The disclosure also relates to an aircraft having at least one power electronic module of the above type.

DETAILED DESCRIPTION

FIGS. 2 to 6 schematically illustrate the various manufacturing steps of a power electronic module 1 according to one embodiment of the disclosure.

Figure 1:
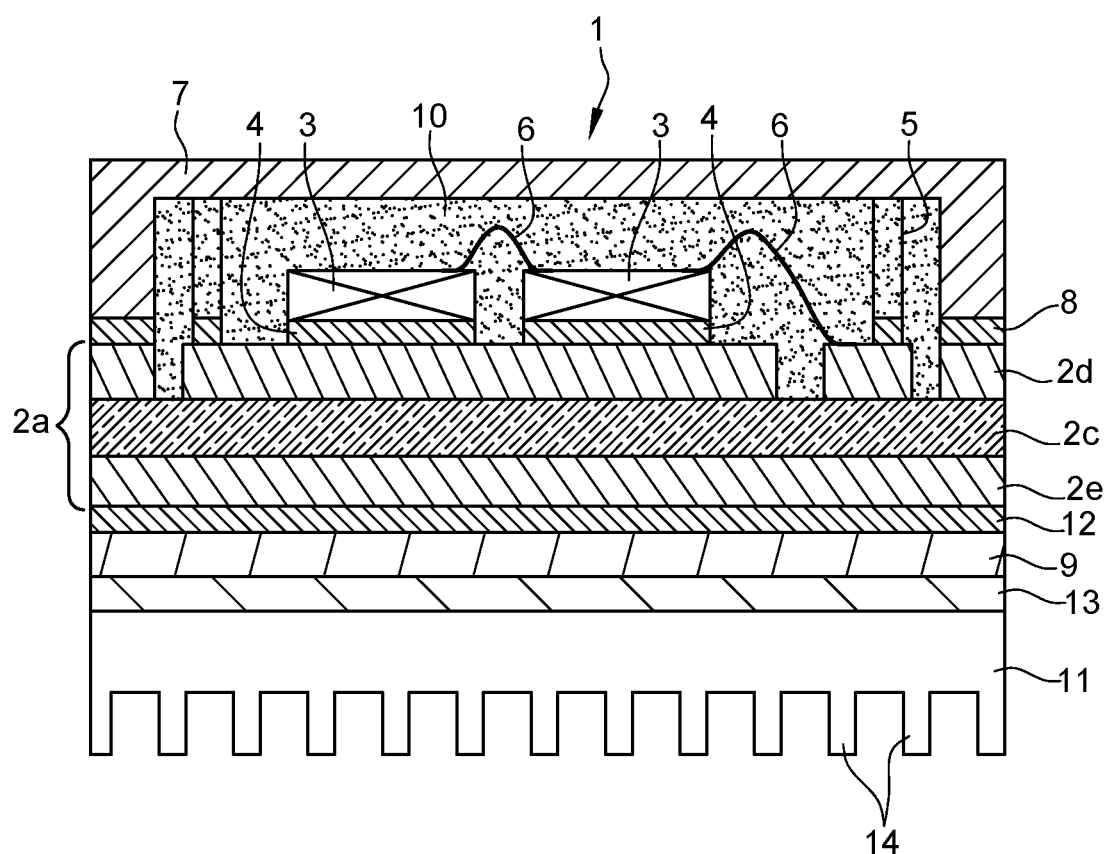
FIG. 1 is a schematic view illustrating a power electronic module of the prior art.
Figure 2:
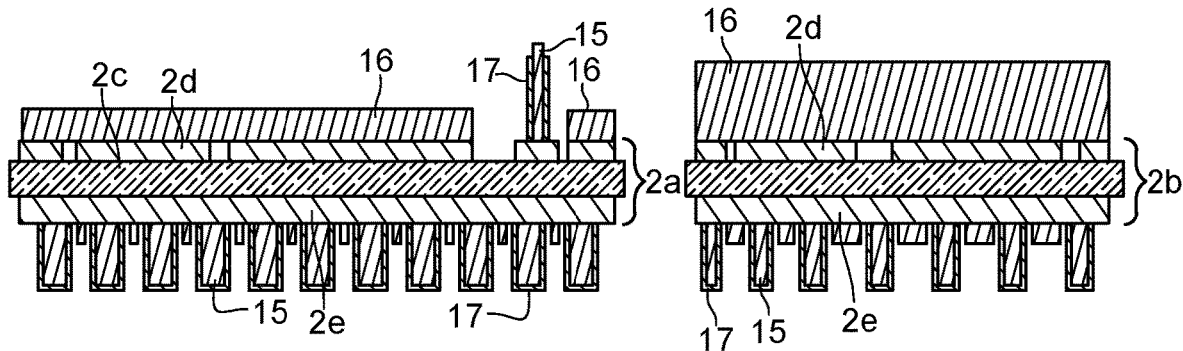
FIG. 2.
Figure 3:
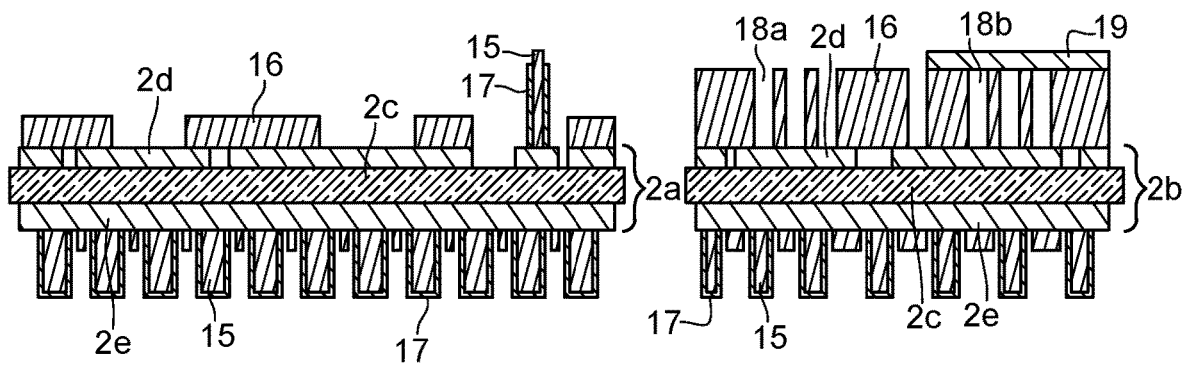
FIG. 3.

In a first step illustrated in FIG. 2, preforms 15 of polymeric material are made by additive manufacturing on two opposite sides of a first metallized substrate 2a and a second metallized substrate 2b. The preforms 15 may be made directly on each metallized substrate 2a, 2b or may be attached to the metallized substrate 2a, 2b after making the preforms 15. In the latter case, the preforms 15 may be bonded to the corresponding metallized substrate 2a, 2b.

Each metallized substrate 2a, 2b comprises an electrically insulating layer 2c of ceramic material coated on each of its opposite sides with a metal layer 2d, 2e, for example, of copper. The metal layers 2d, 2e of the metallized substrate 2a, 2b can be joined to the insulating layer 2c by soldering (or "Active Metal Brazing" or "AMB"), by direct bonding of copper (or "DBC"), or by direct bonding of aluminum (or "DBA").

Alternatively, the electrically insulating layer 2c may be made of a polymeric material (in the case of an IMS or Insulated Metal Substrate).

The metal layers 2d form electrically separate tracks from each other.

Protective films 16 of polymeric material cover at least a portion of the conductive tracks of the top layer 2d.

As shown in FIG. 2, a first metal layer 17, for example of silver or copper, is deposited on the preforms 15, for example by chemical reduction via spraying. The first layer 17 has a thickness of less than 1 micron for example. Other deposition techniques can be used, such as spray coating or dip coating.

Some of the preforms 15 may be pre-metallized, i.e. coated with the first metal layer 17 before assembly on the corresponding metallized substrate 2a, 2b.

openings 18a, 18b are formed in the protective film 16 covering the second substrate 2b, some of these openings (i.e. openings 18b) being covered with an auxiliary protective film 19.

Figure 4:
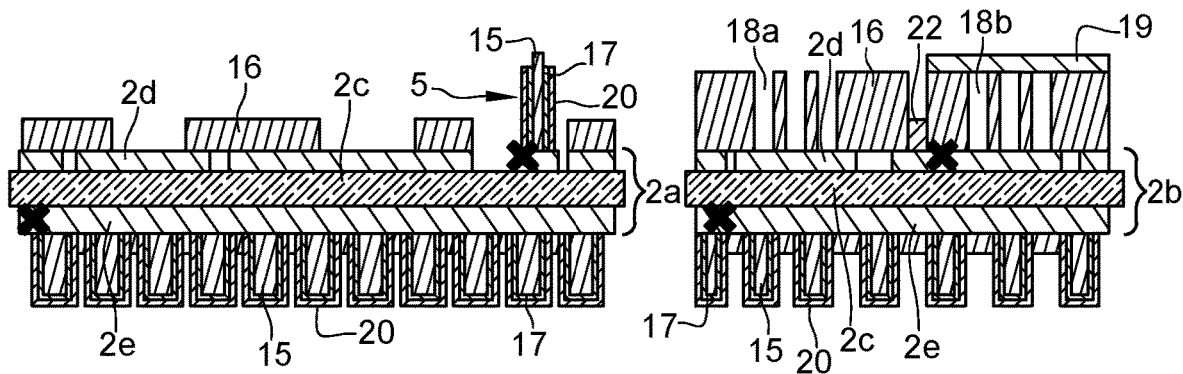
FIG. 4.

A second metal layer 20, for example, of copper, is then deposited on the first metal layer 17, as shown in FIG. 4. Such a deposit is made by electroforming.

The second layer 20 has a thickness of between a few microns and a few millimeters, as required. The thickness of the second layer 20 can be varied as a function of the applied voltage and bias time applied during the electroforming deposition step.

During electroforming, all or part of the metallized substrate 2a, 2b and the first metal layer 17 is immersed in an electrolytic bath comprising metal ions, for example copper in ionic form. The bath may be a low-temperature bath, i.e., a temperature below 100° C. An electrode is electrically connected to some of the conductive tracks of the layers 2d of the substrates 2a, 2b and the metal layers 2e of the substrates 2a, 2b. The conductor tracks or layers connected to the electrode are shown with crosses in FIG. 4. An electrical potential is applied to these areas, via the electrode, so as to deposit the filler metal of the electrolytic bath on the first metal layer 17. The non-metallic areas of the substrate 2a, 2b, the areas covered by the protective film 16 or the metallic areas which are not at the electrode potential, are then not covered with filler metal.

The second metal layer 17 can in particular delimit connectors 5, housing parts, cooling channels 21 of heat sinks or radiators 11 and spikes 22.

Figure 5:
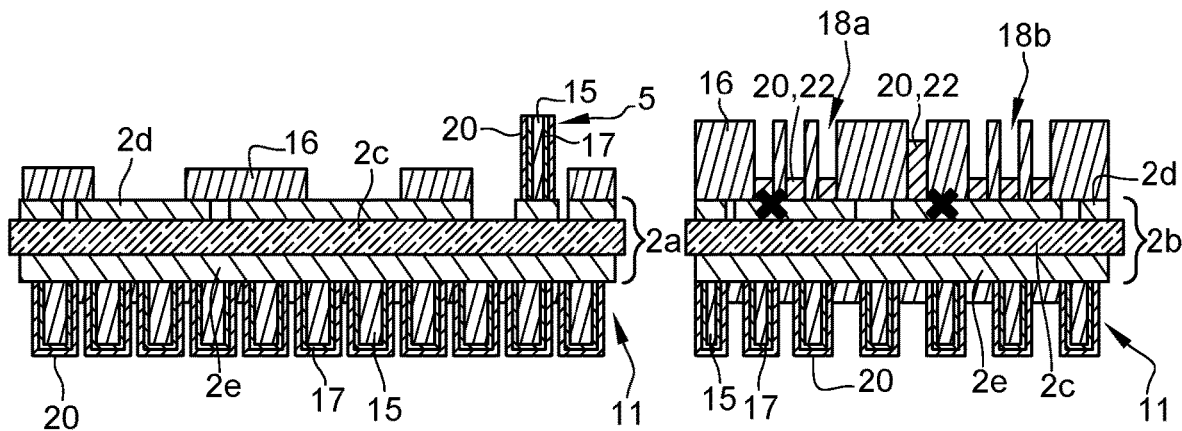
FIG. 5.

The deposition of the second layer 20 can be performed in several steps, as illustrated in FIGS. 4 and 5. In a first step illustrated in FIG. 4, the openings 18b are covered by the auxiliary protective film 19, so that only the opening(s) 18a whose corresponding conductor track(s) is (are) at the desired electrical potential are progressively filled with filler metal 20. In a second step illustrated in FIG. 5, the auxiliary protective film 19 is removed, uncovering the openings 18b, so that filler metal can also be deposited in these openings 18b, provided that the corresponding conductor tracks are at the desired electrical potential. In this way, it is possible to make spikes 22 of different lengths, depending on the tracks connected to the electrode and/or depending on the openings 18a, 18b covered by the auxiliary film 19.

Figure 6:
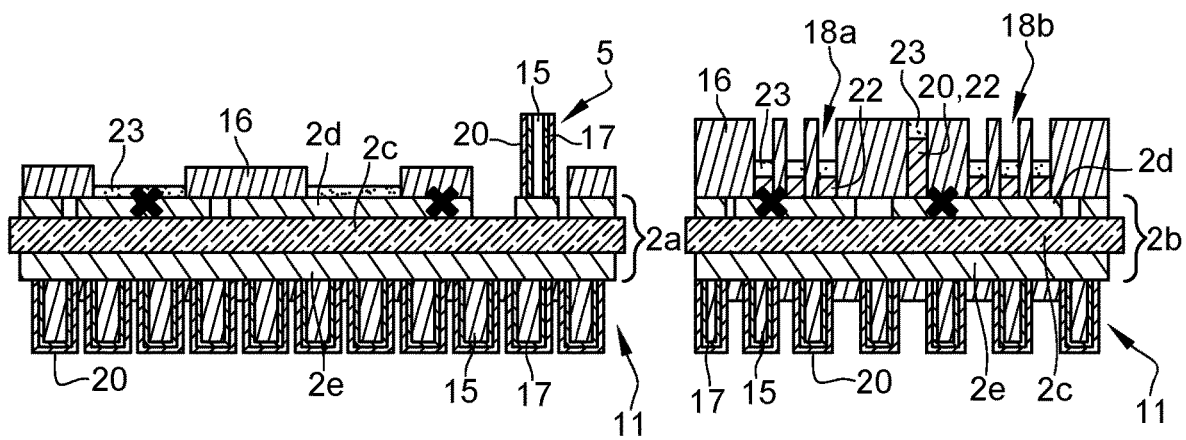
FIG. 6.

A layer of electrically conductive nanoporous material 23 is then deposited on certain tracks of the metal layers 2d of the first and second metallized substrates 2a, 2b, as shown in FIG. 6.

The layer of nanoporous material 23 has, for example, a thickness between 1 and 100 microns. The nanoporous material has pores with dimensions of less than 1 micron.

The nanoporous layer 23 is produced by dipping in an electrolytic bath, the relevant tracks being connected to a potential via an electrode, as illustrated schematically by crosses in FIG. 6. The nanoporous material is obtained in a single step by adding additives to the electrolyte bath and/or by using current pulses, as is known per se.

Figure 7:
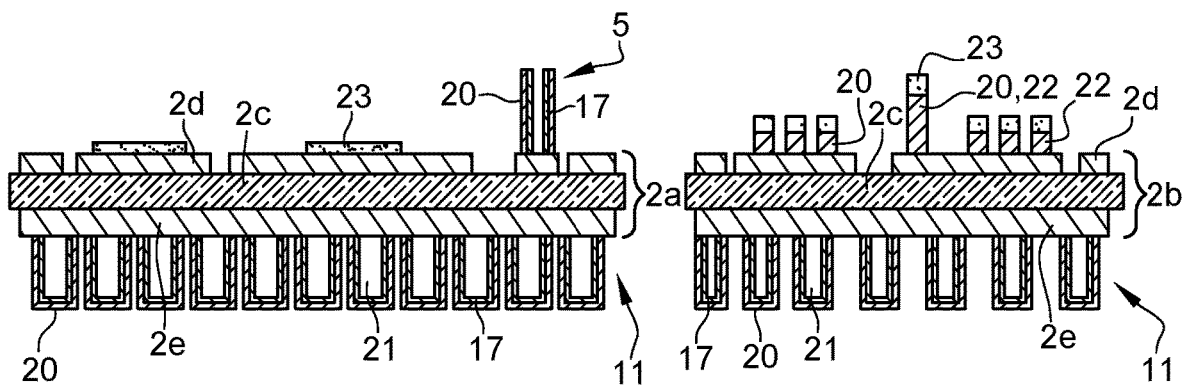
FIG. 7.

As shown in FIG. 7, the preforms 15 are then removed in a chemical or thermal dissolution step.

In the case of chemical dissolution, ABS preforms 15 can be dissolved in an acetone bath at a temperature of 50° C. using ultrasound.

Alternatively, in order to dissolve PLA preforms 15, a 35% soda bath can be used at a temperature of 60° C. and stirring can be carried out to promote dissolution.

It is thus possible to create recessed areas, connectors 5 or channels 21 intended to facilitate heat exchange for the purpose of cooling the assembly, for example by means of a flow of air or a liquid coolant.

The protective films 16 may also be removed during the dissolving step.

Figure 8:
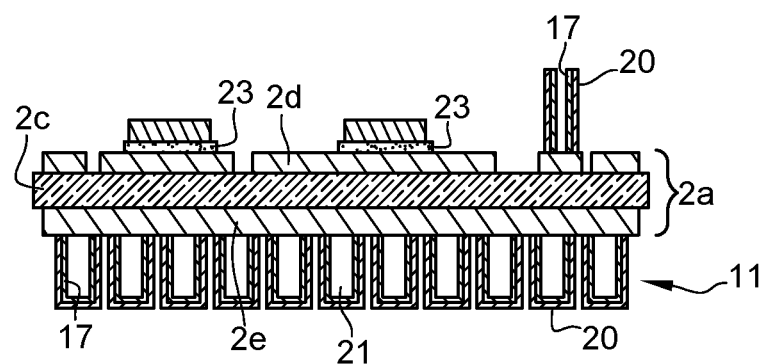
FIG. 8.
Figure 9:
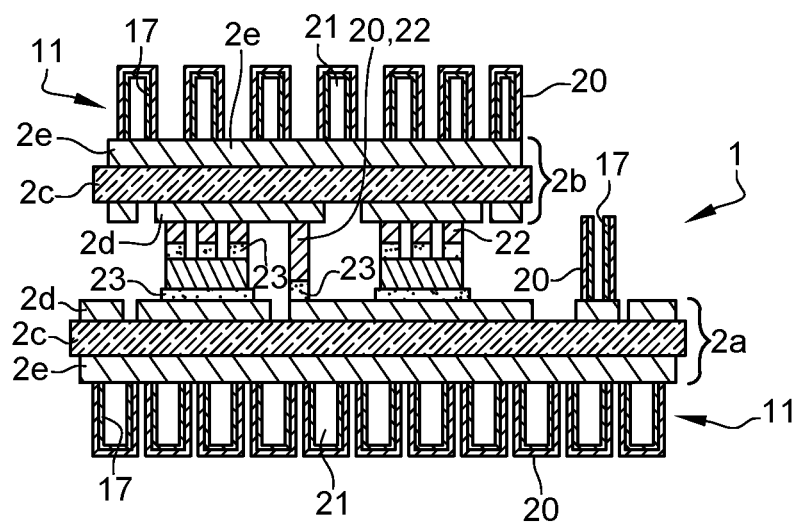
FIG. 9 illustrate various steps of a method of manufacturing a power electronic module according to an embodiment of the disclosure.

Active components of the semiconductor power component type 3 are deposited on the layer of nanoporous material 23 deposited on the first metallized substrate 2a (FIG. 8). The layer of nanoporous material 23 is then sintered so as to provide a mechanical and electrical bond between a first face of the components 3 and the first metallized substrate 2a. The second metallized substrate 2b is then placed opposite the first metallized substrate so that the layer of nanoporous material 23 deposited on the ends of the spikes 22 are in contact with the second face of the components 3 and with one of the tracks of the first metallized substrate 2a, respectively (FIG. 9). The layer of nanoporous material 23 is then sintered so as to ensure a mechanical and electrical connection between the spikes 22, the second face of the components 3 and the corresponding track of the first metallized substrate 2a.

The sintering is carried out at a temperature between 200° C. and 300° C., with the application of a pressure between 1 and 10 MPa, in the case of a nanoporous copper layer. This allows a good mechanical bond to be achieved without impacting the properties of the components 3 and the substrates 2a, 2b to be joined. In order to avoid oxidation, sintering can be carried out in an inert atmosphere or by rapid laser sintering.

A single simultaneous sintering operation of all the layers of nanoporous material 23 may be considered.

A housing attached to the substrates 2a, 2b is then filled with an electrical encapsulant or insulator, such as a gel or epoxy, to provide mechanical and electrical protection for the power components 3.

In particular, such a method has the following advantages:
- realization of a practically finished structure by a method for easy industrialization,
- attachment of power components 3 with small electrodes without risk of short circuiting by means of sintering,
- good thermal performance, due in particular to the reduction of interfaces between the power components 3 and the heat sinks 11 and to the fact that it is possible to produce heat sinks 11 with complex geometrical shapes
- possibility to use the power module 1 at very high temperatures, thanks in particular to the elimination of thermal interface materials whose use is limited in temperature, or thanks to the absence of solder,
- improvement of the reliability due to the absence of soldering,
- increase in the power density of the converters due to the reduction in the mass of the heat sinks 11,
- reduction of the residual stresses compared to the same realization by additive manufacturing techniques requiring very high local temperatures for the fusion or sintering of metallic powders,
- sealing of the channels 21 of the heat sinks 11 thanks to the absence of porosity and gaps in the electro-deposited material 20.

The invention claimed is:

1. A method of manufacturing a power electronic module by additive manufacturing, comprising the steps of:
   depositing in a single step, by electrodeposition, a layer of electrically conductive nanoporous material directly on a substrate comprising an electrically insulating layer and at least one layer of conductive metal material, called a metallized substrate,
   placing an element on the layer of nanoporous material and sintering the layer of nanoporous material to ensure a mechanical and electrical connection between said element and the metallized substrate,
   making or fixing at least one sacrificial preform of polymer material on at least one face of the metallized substrate,
   depositing a first metal layer on the at least one sacrificial preform, and
   depositing a second metal layer on the first metal layer by electroforming to form a metallic structure defined by said at least one sacrificial preform, wherein said at least one sacrificial preform is subsequently removed.

2. The method according to claim 1, wherein the layer of nanoporous material is deposited on the second metal layer.

3. The method according to claim 1, further comprising a step of dissolving the at least one sacrificial preform by chemical or thermal means.

4. The method according to claim 1, further comprising a step of covering at least one area of the conductive layer of the metallized substrate with a protective film made of non-conductive material, before deposition of the first metal layer and of the second metal layer.

5. The method according to claim 4, further comprising a step of carrying out the removal of at least one zone of the protective film to form an opening, a spike being obtained by depositing the first and second metal layers in the said opening.

6. The method according to claim 1, wherein the substrate comprises at least one insulating layer of ceramic.

7. The method according to claim 1, wherein the first metal layer has a thickness of less than 5 microns.

8. The method according to claim 1, wherein the power electronic module comprises a housing in which the metallized substrate and the active component are housed, the method further comprising a step of at least partially filling the housing with an insulating material.

9. The method according to claim 1, wherein the element is an active component of the semiconductor power component type.

10. The method according to claim 7, wherein the first metal layer has a thickness of less than 1 micron.

11. A method of manufacturing a power electronic module by additive manufacturing, comprising the steps of:
    depositing in a single step, by electrodeposition, a layer of electrically conductive nanoporous material directly on a substrate comprising an electrically insulating layer and at least one layer of conductive metal material, called a metallized substrate,
    placing an element on the layer of nanoporous material and sintering the layer of nanoporous material to ensure a mechanical and electrical connection between said element and the metallized substrate,
    making or fixing at least one sacrificial preform of polymer material on at least one face of the metallized substrate,
    depositing a first metal layer on the at least one sacrificial preform, and depositing a second metal layer on the first metal layer by electroforming to form at least one of connectors, housing parts, or cooling channels defined by said at least one sacrificial preform.

12. The method according to claim 11, wherein the layer of nanoporous material is deposited on the second metal layer.

13. The method according to claim 11, further comprising a step of dissolving the at least one sacrificial preform by chemical or thermal means.

14. The method according to claim 11, further comprising a step of covering at least one area of the conductive layer of the metallized substrate with a protective film made of non-conductive material, before deposition of the first metal layer and of the second metal layer.

15. The method according to claim 14, further comprising a step of carrying out the removal of at least one zone of the protective film to form an opening, a spike being obtained by depositing the first and second metal layers in the said opening.

16. The method according to claim 11, wherein the substrate comprises at least one insulating layer of ceramic.

17. The method according to claim 11, wherein the first metal layer has a thickness of less than 5 microns.

18. The method according to claim 11, wherein the power electronic module comprises a housing in which the metallized substrate and the active component are housed, the method further comprising a step of at least partially filling the housing with an insulating material.

19. The method according to claim 11, wherein the element is an active component of the semiconductor power component type.

20. The method according to claim 17, wherein the first metal layer has a thickness of less than 1 micron.

* * * * *